(12) United States Patent
Kenkaraseril et al.

(10) Patent No.: US 6,368,900 B1
(45) Date of Patent: Apr. 9, 2002

(54) METHOD OF FABRICATING AN ANTIFUSE ELEMENT

(75) Inventors: John Prasao Kenkaraseril; Madhusudan Mukhopadhyay; Qi Dong Xiang; Yeow-Meng Teo, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/501,374

(22) Filed: Feb. 11, 2000

(51) Int. Cl.[7] ...................... H01L 21/82; H01L 21/4783
(52) U.S. Cl. ........................................................ 438/131
(58) Field of Search ............................... 438/631, 634, 438/637, 131

(56) References Cited

U.S. PATENT DOCUMENTS

| | | | |
|---|---|---|---|
| 5,663,591 A | 9/1997 | Iranmanesh | 257/530 |
| 5,756,396 A * | 5/1998 | Lee et al. | 438/622 |
| 5,804,500 A | 9/1998 | Hawley et al. | 435/600 |
| 5,807,786 A | 9/1998 | Chang | 438/600 |
| 5,920,109 A | 7/1999 | Hawley et al. | 257/530 |
| 6,043,124 A * | 3/2000 | Wu | 438/260 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 335, 371–73, 518–19, 531–534, 539–42, 581–82.*

* cited by examiner

Primary Examiner—Charles Bowers
Assistant Examiner—William M. Brewster
(74) Attorney, Agent, or Firm—George O. Saile; Rosemary L. S. Pike

(57) ABSTRACT

A process for forming an amorphous silicon, antifuse element, on an underlying, raised tungsten plug structure, has been developed. The process features the recessing of the insulator layer, in which the tungsten plug structure resides, resulting in a raised portion of a tungsten plug structure. Conductive spacers are then formed on the exposed sides of the raised portion of the tungsten plug structure, resulting in smooth edges, at the perophery of the raised tungsten plug structure. An amorphous silicon layer is then deposited and defined to create the amorphous silicon, antifuse element, on the underlying raised tungsten plug structure, smoothed via the addition of the conductive, sidewall spacers. The use of the underlying, smooth, raised tungsten plug structure, alleviates excessive current crowding, presnet at the edges of the raised tungsten plug structure, during a high voltage pulsing procedure, performed to the overlying antifuse element.

23 Claims, 2 Drawing Sheets

METHOD OF FABRICATING AN ANTIFUSE ELEMENT

BACKGROUND OF THE INVENTION (1) Field of the Invention

The present invention relates to methods used to fabricate semiconductor devices, and more specifically to a method used to fabricate a programmable antifuse element, to be used as a vehicle in the replacement of defective components, with spare or replacement components.

(2) Description of Prior Art

Antifuse elements have been used to allow defective regions, in a body of array devices, to be replaced with adjacent, spare device arrays. This is accomplished by placing a programmable antifuse element, between the main body of gate arrays, and a region comprised of replacement gate arrays. The antifuse element is comprised of a high resistance material, such as amorphous silicon, resulting in an "off" state. The high resistance, amorphous silicon layer, although physically connected to both the main body of gate arrays, and the region of replacement arrays, is not electrically connected due its high resistance. A high voltage pulsing procedure, results in the conversion of the high resistance amorphous silicon layer to a low resistance layer, resulting in the "on" state, featuring electrical, as well as physical connection to both the main body of gate arrays, and to the region of spare gate arrays.

One method of providing physical connection between the main body of gate arrays, and the adjacent region of spare gate arrays, is via use of a tungsten plug structure, located between these regions, with the antifuse element overlying the tungsten plug structure. Pulsing of the high resistance, antifuse element results in the desired electrical connection between the main body of gate arrays, and the region of spare gate arrays, physically via the tungsten plug structure, and electrically via conversion of the high resistance amorphous silicon layer to a low resistance material. However the high voltage pulse, applied to a region of the antifuse element, can result in current and field crowding, at the sharp edges of the underlying tungsten plug structure, which in turn results in excess joule heating and non-uniform melting of the antifuse element. The non-uniform melting, in turn results in non-uniform conversion of the antifuse element from the high resistance layer, to the desired low resistance layer.

This invention will describe a novel process sequence in which the current crowding, at the sharp edges of the tungsten plug structure, and the subsequent, excess joule heating of the antifuse element, is avoided via the formation of conductive spacers, on the sides of a protruding tungsten plug structure. First the insulator layer, in which the tungsten plug structure is inlaid in, is etched back, resulting in a tungsten plug structure, which protrudes from the top surface of the insulator layer. This allows subsequent conductive spacers to be formed on the sides of the portion of the tungsten plug structure that is protruding, resulting in a smooth edge for the spacer covered, tungsten plug structure. In addition to protecting, or smoothing the edges of the tungsten plug structure, to alleviate the effects of the high voltage pulsing, the protruding portions of the tungsten plug structure provide additional surface area for contact by overlying layers, thus reducing interface resistance. Prior art, such as Hawley et al, in U.S. Pat. No. 5,920,109, as well as Hawley et al, in U.S. Pat. No. 5,804,500, describe methods for forming raised, or protruding, tungsten plug structures, for use in combination with antifuse elements, however that prior art does not teach the use of the smoothing, conductive spacers, on the sides of the raised tungsten plug structures, needed to avoid current and field crowding, at the sharp edges of the tungsten plug structure, during the high voltage pulsing applied to the antifuse element.

SUMMARY OF THE INVENTION

It is an object of this invention to fabricate a amorphous silicon, antifuse element, as a vehicle to allow replacement of defective regions of a main body of gate arrays, with replacement or spare gate arrays.

It is another object of this invention to use a tungsten plug structure, located in a via hole in an insulator layer, between the main body of gate arrays, and the region of replacement gate arrays.

It is still another object of this invention to etch back the insulator layer, in which the tungsten plug structure resides in, then to form smooth, conductive spacers, on the sides of the raised, or protruding, tungsten plug structure.

It is still yet another object of this invention to form the amorphous silicon, antifuse element, overlying the raised tungsten plug structure, and the smooth, conductive spacers, on the sides of the tungsten plug structure.

In accordance with the present invention a method for forming an antifuse element, on a raised, or protruding, tungsten plug structure, which in turn is located between the main body of gate arrays, and a region of replacement arrays, and featuring conductive spacers formed on the sides of the raised tungsten plug, is described. A first insulator layer is formed on an underlying conductive region, which can be comprised of a main body of gate arrays, or of a conductive layer which directly contacts the main body of gate arrays. A via hole is formed in the first insulator layer, exposing a portion of the top surface of the underlying conductive region, followed by the formation of a tungsten plug structure, in the via hole. A selective etch is used to remove a top portion of the first insulator layer, resulting in a portion of the tungsten plug structure protruding upwards from the top surface of the first insulator layer. Conductive spacers are next formed on the sides of the raised, or protruding portion of tungsten plug structure, resulting in smooth edges for the conductive spacer—tungsten plug structure. An amorphous silicon layer is next deposited, overlying the raised tungsten plug structure, followed by the deposition of a titanium nitride barrier layer. After definition of the titanium nitride, and the amorphous silicon layers, forming the antifuse structure, a second insulator layer is deposited. After formation of a via hole in the second insulator layer, exposing a portion of the top surface of the titanium nitride—amorphous silicon, antifuse structure, a conductive region, comprised of either a region of replacement gate arrays, or a conductive layer directly interfacing with the region of replacement gate arrays, is formed in the via hole, located in the second insulator layer, overlying, and contacting the titanium nitride—amorphous silicon structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
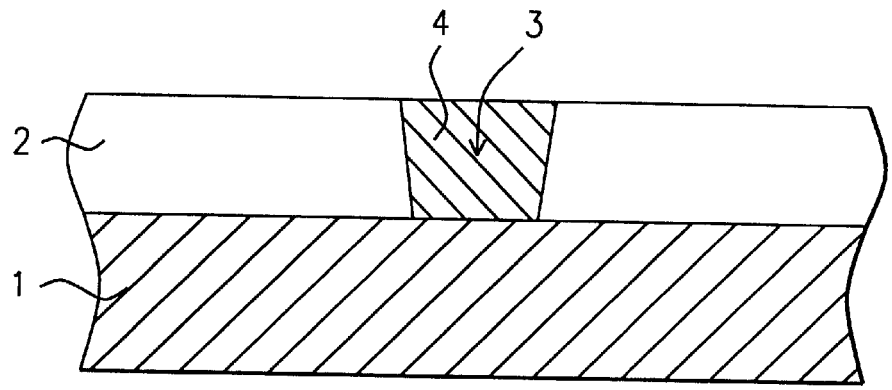
FIGS. 1–5, which schematically, in cross-sectional style, describe key stages of fabrication used to form a antifuse element, on an underlying raised, or protruding tungsten plug structure, featuring conductive spacers located on the sides of the raised portion of tungsten plug structure.

The process of fabricating an amorphous silicon, antifuse element, on an underlying, protruding tungsten plug structure, featuring conductive spacers formed on the sides of the protruding tungsten plug structure, will now be described in detail. Conductive region 1, shown schematically in FIG. 1, can either be a portion of a main body of gate arrays, or conductive region 1, can be a conductive structure, communicating with a main body of gate arrays. An insulator layer 2, comprised of either silicon oxide, or borophosphosilicate glass, (BPSG), is next deposited via low pressure chemical vapor deposition, (LPCVD), or plasma enhanced vapor deposition, (PECVD), procedures, to a thickness between about 5000 to 15000 Angstroms. Conventional photolithographic and reactive ion etching, (RIE), procedures, using $CHF_3$ as an etchant, are used to create via hole 3, in insulator layer 2, exposing a portion of the top surface of conductive region 1. After removal of the photoresist shape used for definition of via hole 3, using plasma oxygen ashing and careful wet cleans, a tungsten layer is deposited, via chemical vapor deposition, (CVD), or via plasma vapor deposition, (PVD), procedures, to a thickness between about 4000 to 8000 Angstroms, completely filling via hole 3. A chemical mechanical polishing, (CMP), procedure is then employed to remove regions of the tungsten layer, from the top surface of insulator layer 2, resulting in the formation of tungsten plug structure 4, in via hole 3. This is schematically shown in FIG. 1.

Figure 2:
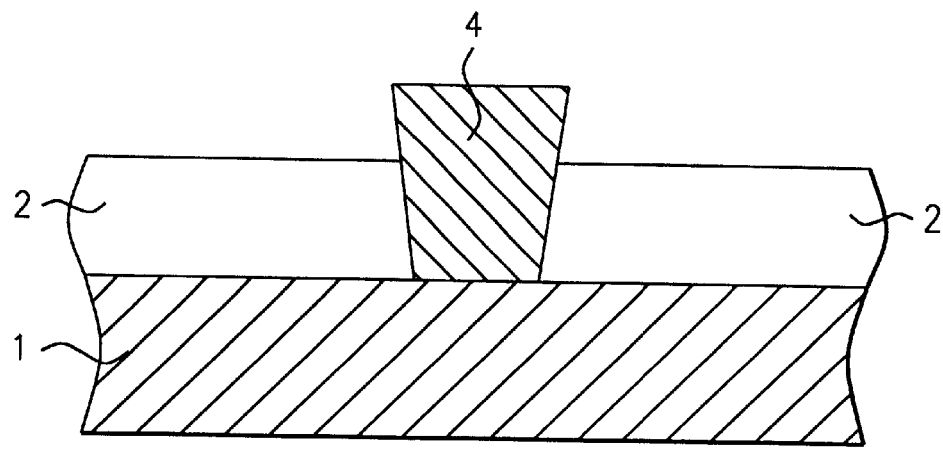
Figure 3:
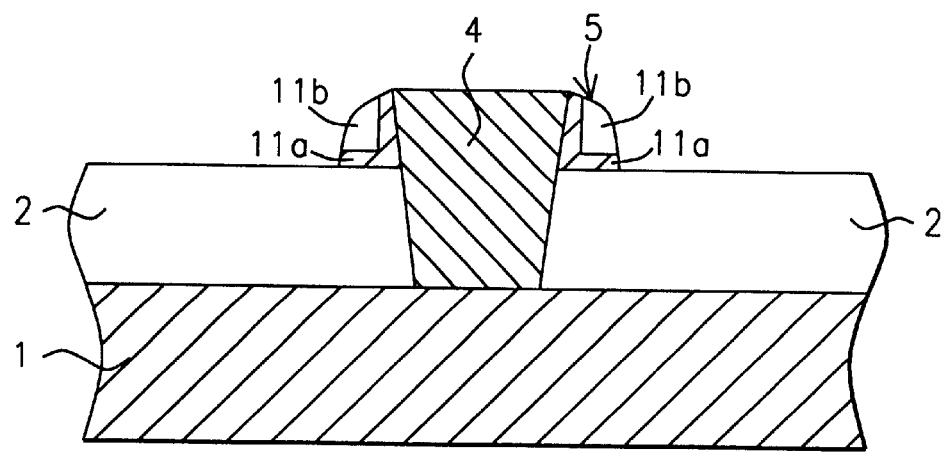

The configuration of tungsten plug structure 4, in via hole 3, when overlaid with the antifuse element, can result in difficulties when subjected to the high voltage pulsing that is used to convert the high resistance amorphous silicon, antifuse element, to the desired low resistance version. During the high voltage pulsing, current, and field crowding, can occur at the sharp corners exhibited by tungsten plug structure 4, in via hole 3. Joule heating, arising from the unwanted current crowding, results in non-uniform melting of the high resistance, amorphous silicon antifuse layer, in turn forming a non-uniform, low resistance, amorphous silicon element. A process sequence used to smooth the sharp corners of tungsten plug structure 4, that will result in reductions in the unwanted current crowding at corners of the tungsten plug structure, and will therefore alleviate the non-uniform melting, and the non-uniform conversion of the overlying antifuse layer, will now be described. The initial step in alleviating the sharp corners of tungsten plug structure 4, is the etch back of insulator layer 2. A buffered hydrofluoric acid solution is used to remove between about 200 to 1000 Angstroms of insulator 2, exposing a portion of the sides of raised, or protruding, tungsten plug structure 4. This is schematically shown in FIG. 2. The exposure of a portion of the sides of tungsten plug structure 4, now allows conductive spacers 5, to be formed on the exposed sides of tungsten plug structure 4. This is accomplished by initially depositing a composite layer, comprised of an underlying, titanium nitride layer 11a, via CVD or PVD procedures, at a thickness between about 100 to 500 Angstroms, followed by the deposition of a thin tungsten layer 11b, via CVD or PVD procedures, at a thickness between about 400 to 2000 Angstroms. An anisotropic RIE procedure, performed using $Cl_2$ or $SF_6$ as an etchant, is used to selectively form conductive spacers 5, comprised titanium layer 11a, and overlying tungsten layer 11b, on the raised sides of tungsten plug structure 4. The smooth edges of the spacer—tungsten plug structure, schematically shown in FIG. 3, will alleviate the current crowding phenomena experienced when high voltage pulsing is applied to a tungsten plug structure, exhibiting non-spacer, or sharp corners. The increases in surface area, accomplished via the insulator etch back procedure, provides additional contact area for a subsequent overlying material, this reducing interface resistance, between materials.

Figure 4:
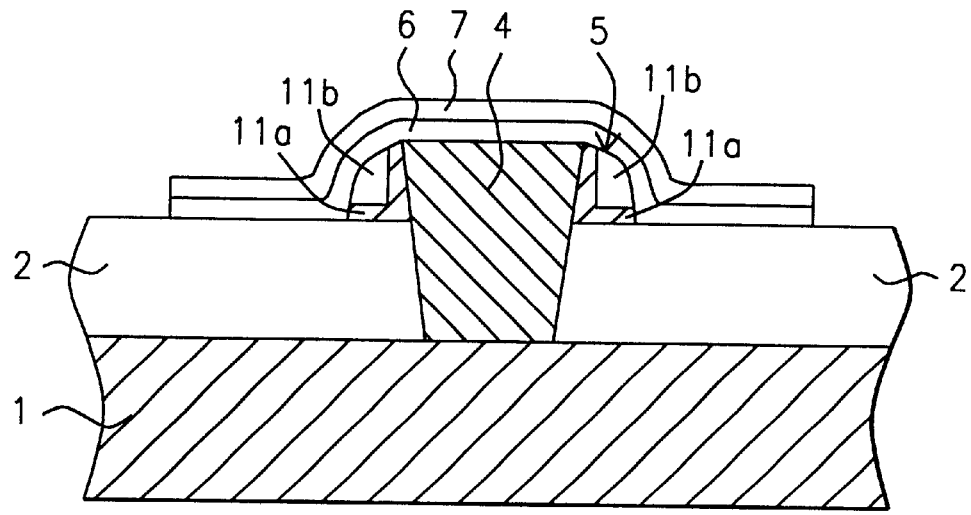

The formation of the antifuse element is next addressed, and schematically shown in FIG. 4. An amorphous silicon layer 6, is deposited via LPCVD procedures, at a temperature between about 200 to 400° C., to a thickness between about 200 to 1500 Angstroms. Amorphous silicon layer 6, is a high resistance layer with a resistivity of about 1E10 ohm-cm. A titanium nitride 7, is deposited, overlying amorphous silicon layer 6, via CVD or PVD procedures, at a thickness between about 1000 to 2000 Angstroms. Titanium nitride layer 7, will serve as a barrier layer, protecting amorphous silicon layer 6, from overlying materials, and processes, which can alter the sensitive resistance characteristics of the antifuse element, comprised of amorphous silicon. Conventional photolithographic and selective RIE procedures, using $Cl_2$ or $SF_6$ as an etchant, are used to define the antifuse structure, comprised of amorphous silicon layer 6, underlying titanium nitride barrier layer 7. The photoresist shape used to define the antifuse structure is then removed via plasma oxygen ashing, followed by a clean procedure, used to clean the surface of the antifuse element, accomplished using a wet developer solution.

Figure 5:
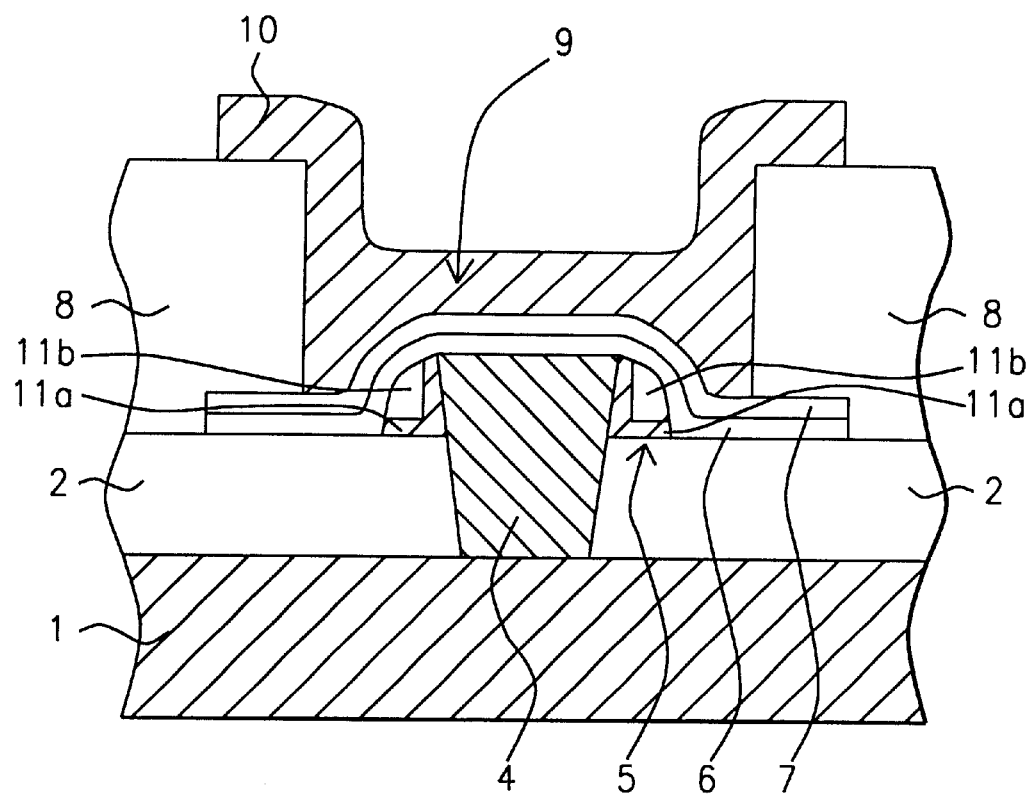

The formation of the region of replacement, or spare gate arrays, is next addressed and schematically shown in FIG. 5. An insulator layer 8, comprised of either silicon oxide, or BPSG, is deposited via LPCVD, or PECVD procedures, to a thickness between about 1000 to 2000 Angstroms. Conventional photolithographic and RIE procedures, using $CHF_3$ as an etchant, are used to open via hole 9, in insulator layer 8, exposing a portion of the top surface of the antifuse structure. Another opening, not shown in the drawings, can also be formed in insulator layer 8, allowing a potential site for subsequent pulsing of the antifuse structure, to be made available. A metal layer, comprised of a metal chosen from a group that includes tungsten, aluminum—copper, or copper, is deposited, via PVD procedures, to a thickness between about 5000 to 8000 Angstroms. Conventional photolithographic and RIE procedures are then employed to define conductive structure 10, shown schematically in FIG. 5. Conductive region 10, can be a region of replacement, or spare gate arrays, or conductive region 10, can be a conductive link to a region of replacement gate arrays. Another conductive structure, not shown in the drawings, is also formed in another opening in insulator layer 8, overlying and contacting a portion of the top surface of the antifuse element. This structure is used to conduct the high voltage pulse to the high resistance amorphous silicon, antifuse element, resulting in the conversion to a low resistance amorphous silicon antifuse element, in turn allowing connection between conductive region 1, and conductive region 10. The photoresist shape used to define conductive structure 10, is removed via plasma oxygen ashing and careful wet cleans.

While this invention has been particularly shown and described with reference to, the preferred embodiments thereof, it will be understood by those skilled in the art that various changes in form and details may be made without departing from the spirit and scope of this invention.

What is claimed is:

1. A method of forming an antifuse element, on a semiconductor substrate, comprising the steps of:
providing a conductive region, comprised with a body of gate array devices;
forming a via hole, in a first insulator layer, exposing a portion of said conductive region;
forming a metal plug structure, comprised with a smooth top surface, in said via hole;
removing a top portion of said first insulator layer, resulting in a raised portion of said metal plug structure, protruding upward from the top surface of the etched back, insulator layer;
forming conductive spacers only on the sides of said raised portion of said metal plug structure;
depositing an amorphous silicon layer, overlying said smooth top surface of said metal structure;
depositing a titanium nitride layer on said amorphous silicon layer; and
patterning of said titanium nitride layer, and of said amorphous silicon layer to form said antifuse element, comprised of said amorphous silicon layer, located underlying said titanium nitride layer.

2. The method of claim 1, wherein said first insulator layer is either comprised of silicon oxide, or borophosphosilicate glass, obtained via LPCVD or PECVD procedures, at a thickness between about 5000 to 15000 Angstroms.

3. The method of claim 1, wherein said via hole, in said insulator layer, is formed via a RIE procedure, using $CHF_3$ as an etchant.

4. The method of claim 1, wherein said metal plug structure is a tungsten plug structure, formed from a tungsten layer which is obtained via CVD, or PVD procedures, at a thickness between about 4000 to 8000 Angstroms.

5. The method of claim 1, wherein said metal plug structure is formed in said via hole via removal of regions of a metal layer, from the top surface of said insulator layer, via a chemical mechanical polishing procedure.

6. The method of claim 1, wherein said top portion of said insulator layer, at a thickness between about 200 to 1000 Angstroms, is removed via a selective wet etch procedure, using a buffered hydrofluoric acid solution.

7. The method of claim 1, wherein said conductive spacers, on the sides of said raised portion of said metal plug structure, is comprised of an underlying layer of titanium nitride, obtained via PVD, or CVD procedures, at a thickness between about 100 to 500 Angstroms, and comprised of an overlying layer of tungsten, obtained via CVD, or PVD procedures, at a thickness between about 400 to 2000 Angstroms.

8. The method of claim 1, wherein said conductive spacers are formed on the sides of said raised portion of said metal plug structure, via an anisotropic RIE procedure, using $Cl_2$ or $SF_6$ as an etchant.

9. The method of claim 1, wherein said amorphous silicon layer is obtained via LPCVD procedures, at a temperature between about 200 to 400° C., to a thickness between about 200 to 1500 Angstroms.

10. The method of claim 1, wherein said titanium nitride layer is obtained via PVD procedures, to a thickness between about 1000 to 2000 Angstroms.

11. A method of forming an amorphous silicon, antifuse element, overlying a raised tungsten plug structure, featuring conductive composite spacers formed on the sides of the raised portion of the tungsten plug structure; comprising the steps of:

providing a conductive region, comprised with a body of gate array devices;
depositing a silicon oxide layer;
opening a via hole in said silicon oxide layer, exposing a portion of a conductive component in said body of gate array devices;
depositing a first tungsten layer, completely filling said via hole;
removing regions of said first tungsten layer from the top surface of said silicon oxide layer, creating a tungsten plug structure, in said via hole, and with said tungsten plug structure comprised with sharp corners at the top perimeter of said via hole and comprised with a smooth top surface;
performing a selective wet etch to recess said silicon oxide layer, resulting in said raised tungsten plug structure, with a top portion of said raised tungsten plug structure protruding upward from the top surface the recessed silicon oxide layer;
depositing a first titanium nitride layer;
depositing a tungsten layer;
performing an anisotropic reactive ion etching procedure to form conductive composite spacers, comprised of underlying said first titanium nitride layer, and of overlying tungsten layer, on the sides of said top portion of said raised tungsten plug structure, via removal of said first titanium nitride layer and said tungsten layer from said smooth top surface of said raised tungsten plug structure;
depositing an amorphous silicon layer, directly overlying said smooth top surface of said raised tungsten plug structure, and overlying said conductive composite spacers;
depositing a second titanium nitride layer;
patterning of said second titanium nitride layer, and of said amorphous silicon layer, to form said antifuse element, comprised of said amorphous silicon, underlying said second titanium nitride layer, with said antifuse element overlying said smooth top surface of said raised tungsten plug structure, and overlying said composite spacers; and
performing a clean procedure to said antifuse element, via use of a wet developer solution.

12. The method of claim 11, wherein said silicon oxide layer is obtained via LPCVD or PECVD procedures, at a thickness between about 5000 to 15000 Angstroms.

13. The method of claim 11, wherein said via hole, in said silicon oxide layer, is formed via a RIE procedure, using $CHF_3$ as an etchant.

14. The method of claim 11, wherein said first tungsten layer is obtained via CVD, or PVD procedures, at a thickness between about 4000 to 8000 Angstroms.

15. The method of claim 11, wherein said tungsten plug structure is formed in said via hole, via removal of regions of said tungsten layer, from the top surface of said silicon oxide layer, via a chemical mechanical polishing procedure.

16. The method of claim 11, wherein said selective wet etch procedure, used to remove a top portion of said silicon oxide layer, is performed using a buffered hydrofluoric acid solution.

17. The method of claim 11, wherein said top portion of said silicon oxide, removed via said selective wet etch procedure, is between about 200 to 1000 Angstroms.

18. The method of claim 11, wherein said conductive composite spacers are comprised with underlying, said first titanium nitride layer obtained via PVD, or CVD procedures, at a thickness between about 100 to 500 Angstroms.

19. The method of claim 11, wherein said conductive composite spacers are comprised with overlying said tungsten layer, obtained via CVD, or via PVD procedures, at a thickness between about 400 to 2000 Angstroms.

20. The method of claim 11, wherein said conductive composite spacers are formed via an anisotropic RIE procedure, using $Cl_2$ or $SF_6$ as an etchant for second tungsten layer and for first titanium nitride layer.

21. The method of claim 11, wherein said amorphous silicon layer is obtained via LPCVD procedures, at a temperature between about 200 to 400° C., to a thickness between about 200 to 1500 Angstroms.

22. The method of claim 11, wherein said second titanium nitride layer is obtained via PVD procedures, to a thickness between about 1000 to 2000 Angstroms.

23. The method of claim 11, wherein said antifuse element, comprised of said amorphous silicon layer, underlying said second titanium nitride layer, is defined via a selective RIE procedure, using $Cl_2$ or $SF_6$ as an etchant.

* * * * *